(12) United States Patent
Tsubuku et al.

(10) Patent No.: US 9,748,401 B2
(45) Date of Patent: *Aug. 29, 2017

(54) TRANSISTOR AND SEMICONDUCTOR DEVICE

(71) Applicant: Semiconductor Energy Laboratory Co., Ltd., Atsugi-shi, Kanagawa-ken (JP)

(72) Inventors: Masashi Tsubuku, Kanagawa (JP); Takayuki Inoue, Kanagawa (JP); Suzunosuke Hiraishi, Kanagawa (JP); Erumu Kikuchi, Kanagawa (JP); Hiromichi Godo, Kanagawa (JP); Shuhei Yoshitomi, Kanagawa (JP); Koki Inoue, Kanagawa (JP); Akiharu Miyanaga, Tochigi (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/547,285

(22) Filed: Nov. 19, 2014

(65) Prior Publication Data

US 2015/0069393 A1    Mar. 12, 2015

Related U.S. Application Data

(63) Continuation of application No. 13/164,296, filed on Jun. 20, 2011, now Pat. No. 8,895,976.

(30) Foreign Application Priority Data

Jun. 25, 2010    (JP) ................................ 2010-144694

(51) Int. Cl.
    *H01L 29/786*    (2006.01)
    *H01L 29/40*    (2006.01)

(52) U.S. Cl.
    CPC ........ *H01L 29/7869* (2013.01); *H01L 29/408* (2013.01)

(58) Field of Classification Search
    CPC ......................... H01L 29/7869; H01L 29/408
    See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 1852923 A | 11/2007 |

(Continued)

OTHER PUBLICATIONS

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

(Continued)

*Primary Examiner* — Long Pham
(74) *Attorney, Agent, or Firm* — Fish & Richardson P.C.

(57) ABSTRACT

Manufactured is a transistor including an oxide semiconductor layer, a source electrode layer and a drain electrode layer overlapping with part of the oxide semiconductor layer, a gate insulating layer overlapping with the oxide semiconductor layer, the source electrode layer, and the drain electrode layer, and a gate electrode overlapping with part of the oxide semiconductor layer with the gate insulat- (Continued)

ing layer provided therebetween, wherein, after the oxide semiconductor layer which is to be a channel formation region is irradiated with light and the light irradiation is stopped, a relaxation time of carriers in photoresponse characteristics of the oxide semiconductor layer has at least two kinds of modes: $\tau_1$ and $\tau_2$, $\tau_1 < \tau_2$ is satisfied, and $\tau_2$ is 300 seconds or less. In addition, a semiconductor device including the transistor is manufactured.

13 Claims, 16 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,656,779 B1 | 12/2003 | Kasahara |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,138,657 B2 | 11/2006 | Kasahara |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,906,780 B2 | 3/2011 | Iwasaki |
| 7,910,920 B2 | 3/2011 | Park et al. |
| 7,935,964 B2 | 5/2011 | Kim et al. |
| 8,084,331 B2 | 12/2011 | Ofuji et al. |
| 8,158,975 B2 | 4/2012 | Akimoto |
| 8,313,980 B2 | 11/2012 | Akimoto |
| 8,415,198 B2 | 4/2013 | Itagaki et al. |
| 8,450,732 B2 | 5/2013 | Kim et al. |
| 8,530,246 B2 | 9/2013 | Ofuji et al. |
| 8,614,442 B2 | 12/2013 | Park et al. |
| 8,878,172 B2 | 11/2014 | Ito et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0063199 A1 | 3/2007 | Kasahara |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0174939 A1 | 7/2007 | Sargent et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0257256 A1 | 11/2007 | Kugler |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197350 A1 | 8/2008 | Park et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0325341 A1 | 12/2009 | Itagaki et al. |
| 2010/0065844 A1 | 3/2010 | Tokunaga |
| 2010/0090217 A1 | 4/2010 | Akimoto |
| 2010/0092800 A1 | 4/2010 | Itagaki et al. |
| 2010/0102311 A1 | 4/2010 | Ito et al. |
| 2010/0109002 A1 | 5/2010 | Itagaki et al. |
| 2011/0240988 A1 | 10/2011 | Yano et al. |
| 2013/0045568 A1 | 2/2013 | Akimoto |
| 2015/0048364 A1 | 2/2015 | Ito et al. |
| 2016/0201187 A1 | 7/2016 | Yano et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |

(56) References Cited

FOREIGN PATENT DOCUMENTS

| | | |
|---|---|---|
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2006-234738 A | 9/2006 |
| JP | 2007-201366 A | 8/2007 |
| JP | 2007-300112 A | 11/2007 |
| JP | 2008-053356 A | 3/2008 |
| JP | 2008-205469 A | 9/2008 |
| JP | 2009-212443 A | 9/2009 |
| JP | 2009-277702 A | 11/2009 |
| JP | 2010-040552 A | 2/2010 |
| JP | 2010-103360 A | 5/2010 |
| JP | 2010-114432 A | 5/2010 |
| JP | 2010-530634 | 9/2010 |
| WO | WO-2004/114391 | 12/2004 |
| WO | WO-2007/086291 | 8/2007 |
| WO | WO-2008/023553 | 2/2008 |
| WO | WO-2008/156311 | 12/2008 |
| WO | WO-2008/156312 | 12/2008 |
| WO | WO-2009/110623 | 9/2009 |
| WO | WO-2009/139482 | 11/2009 |
| WO | WO-2010/023889 | 3/2010 |

OTHER PUBLICATIONS

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Lee.K et al., "The effect of moisture on the photon-enhanced negative bias thermal instability in Ga—In—Zn—O thin film transistors", Appl. Phys. Lett. (Applied Physics Letters) , Dec. 7, 2009, vol. 95, No. 23, pp. 232106-1-232106-3.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Nakamura.M, "Synthesis of Homologous Compound with New Long-Period Structure", NIRIM Newsletter, Mar. 1, 1995, vol. 150, pp. 1-4.
Kimizuka.N et al., "SPINEL,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.
Lee.D et al., "Steady-state photoconductivity of amorphous In—Ga—Zn—O", Thin Solid Films, Mar. 31, 2010, vol. 518, No. 11, pp. 3000-3003.
Ghaffarzadeh.K et al., "Persistent photoconductivity in Hf—In—Zn—O thin film transistors", Appl. Phys. Lett. (Applied Physics Letters) , 2010, vol. 97, No. 14, pp. 143510-1-143510-3.
Inoue.T et al., "New construction of photoconductivity and its spectral response in amorphous In—Ga—Zn—O", AM-FPD '10 Digest of Technical Papers, Jul. 5, 2010, pp. 33-36.
Tsubuku.M et al., "Photo-Current Response and Negative Bias Stability Under Light Irradiation in IGZO-TFT", IDW '10 : Proceedings of the 16th International Display Workshops, Dec. 1, 2010, pp. 1841-1844.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kitzerow.H et al., "Observation of Blue Phases in Chiral Networks", Liquid Crystals, 1993, vol. 14, No. 3, pp. 911-916.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer"Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 : Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-in. AMOLED Display With

(56) References Cited

OTHER PUBLICATIONS

Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility Zno Thin-Film Transistors Produced At Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B) Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

FIG. 3A

FIG. 3B electron conduction band (Ec)

"safe" trap valence band (Ev)

hole electron hole

TRANSISTOR AND SEMICONDUCTOR DEVICE

CROSS-REFERENCE TO RELATED APPLICATIONS

This application is a continuation of U.S. application Ser. No. 13/164,296, filed Jun. 20, 2011, now allowed, which claims the benefit of a foreign priority application filed in Japan as Serial No. 2010-144694 on Jun. 25, 2010, both of which are incorporated by reference.

BACKGROUND OF THE INVENTION

1. Field of the Invention

The present invention relates to a transistor and a semiconductor device at least part of which includes the transistor.

Note that in this specification, a semiconductor device means any device that can function by utilizing semiconductor characteristics. An electro-optical device such as a liquid crystal display device or a light-emitting device, a semiconductor circuit, and an electronic device are all semiconductor devices.

2. Description of the Related Art

Although transistors including silicon semiconductors have been used for conventional display devices typified by liquid crystal televisions, oxide semiconductors have attracted attention as a material which replaces silicon semiconductors. For example, an active matrix display device in which an amorphous oxide containing In, Ga, and Zn is used for an active layer of a transistor and the electron carrier concentration of the amorphous oxide is lower than $10^{18}/cm^3$ is disclosed (see Patent Document 1).

However, some problems of a transistor formed using an oxide semiconductor have been pointed out. One of the problems is stability of characteristics, and it is pointed out that electrical characteristics are changed by irradiation with visible light or ultraviolet light (e.g., see Non-Patent Document 1).

REFERENCE

Patent Document

[Patent Document 1] Japanese Published Patent Application No. 2006-165528

Non-Patent Document

[Non-Patent Document 1] Dong Hee Lee, Ken-ichi Kawamura, Kenji Nomura, Hiroshi Yanagi, Toshio Kamiya, Masahiro Hirano, and Hideo Hosono, "Steady-state photoconductivity of amorphous In—Ga—Zn—O", Thin Solid Films, Vol. 518, pp. 3000-3003 (2010).

SUMMARY OF THE INVENTION

An oxide semiconductor formed using a metal oxide has a band gap of approximately 3 eV and originally transmits visible light. However, it is known that a film formed using the oxide semiconductor deteriorates when being irradiated with intense light (the deterioration is called light deterioration).

Any method for improving such a change in the characteristics caused by light in a transistor including an oxide semiconductor has not been proposed, which causes a delay in practical use of the oxide semiconductor which is expected as a new material.

In addition, in a liquid crystal display device in which a backlight is used, a transistor including an oxide semiconductor is irradiated with light from the backlight in some cases. In such a case, leakage current might be generated by photoexcitation even in an off state of the transistor, which leads to reduction in display quality or light deterioration.

An object of one embodiment of the present invention is to provide a transistor in which light deterioration is suppressed as much as possible and electrical characteristics are stable, and a semiconductor device including the transistor.

A mechanism of generation of photoelectric current due to irradiating an oxide semiconductor layer with light will be described below.

Carriers in a semiconductor can be expressed by continuity equations shown in Formula 1 and Formula 2.

$$\frac{dn}{dt} = \frac{1}{q}\frac{\partial J_n}{\partial x} + (G_n - R_n) \qquad \text{[Formula 1]}$$

$$\frac{dp}{dt} = \frac{1}{q}\frac{\partial J_p}{\partial x} + (G_p - R_p) \qquad \text{[Formula 2]}$$

In the above two formulas, t represents time, x represents position, and q represents charge. Here, n represents carrier concentration of electrons, p represents carrier concentration of holes, $J_n$ represents a current value of electrons, $J_p$ represents a current value of holes, $G_n$ represents a generation probability of electrons, $G_p$ represents a generation probability of holes, $R_n$ represents a probability of recombination, and $R_p$ represents a probability of recombination. When the carrier concentration of holes is divided into a carrier concentration of holes $p_o$ in a thermal equilibrium state and a difference of carrier concentration of holes $\Delta p$ from the thermal equilibrium state, the carrier concentration of holes can be expressed by Formula 3.

$$p = p_o + \Delta p \qquad \text{[Formula 3]}$$

When a semiconductor is irradiated with light having an energy of greater than or equal to the band gap and absorbs the light, electrons in the valence band are transferred to the conduction band and holes are generated. When the generation probability of holes is represented by $G_{Op}$, the probability of recombination is expressed by Formula 4. Here, $\tau_p$ represents a relaxation time of holes generated.

$$R = \frac{p}{\tau_p} = \frac{p_0}{\tau_p} + \frac{\Delta p}{\tau_p} \qquad \text{[Formula 4]}$$

Suppose that diffusing light in a source direction or a drain direction can be ignored when a device is uniformly irradiated with light, a continuity equation represented by Formula 5 is obtained.

$$\frac{d(\Delta p)}{dt} = G_{op} - R = G_{op} - \frac{\Delta p}{\tau_p} \qquad \text{[Formula 5]}$$

When Formula 5 is solved under the condition that an initial photoelectric current value is 0, the carrier concentration is expressed by Formula 6.

$$\Delta p(t) = G_{op}\tau_p \left[1 - \exp\left(-\frac{t}{\tau_p}\right)\right] \quad \text{[Formula 6]}$$

When the time at which a light source is turned off is represented by $t_o$, the carrier concentration is expressed by Formula 7.

$$\Delta p(t) = \Delta p(t_0)\exp\left(-\frac{t-t_0}{\tau_p}\right)(t \geq t_0) \quad \text{[Formula 7]}$$

Since the photoelectric current is in proportion to excess carrier concentration, the current formula is expressed by Formula 8.

$$I(t) = \begin{cases} I_0\left[1 - \exp\left(-\frac{t}{\tau_p}\right)\right](0 \leq t \leq t_0) \\ I_0\left[1 - \exp\left(-\frac{t_0}{\tau_p}\right)\right]\exp\left(-\frac{t-t_0}{\tau_p}\right)(t \geq t_0) \end{cases} \quad \text{[Formula 8]}$$

($I_O$ is a constant, which depends on physical property and structure.)

The relaxation time τ depends on a model of carrier recombination. There are basically two types of recombination processes: direct recombination and indirect recombination (SRH recombination).

Further, there are traps that can trap holes easily but cannot trap electrons easily and where recombination hardly occurs. Such a trap is called a "safe" trap in this specification.

FIG. 3A is a schematic diagram of the "safe" trap. FIG. 3B is a schematic diagram showing a transition due to heat after trapping.

Since the energy position of the "safe" trap is closer to the valence band than the intrinsic Fermi level and an electron is not easily trapped by the "safe" trap, some holes trapped by the "safe" traps can be transferred to the valence band by heat and thus contribute to electric conduction. The relaxation time in photoresponse characteristics (photoresponse characteristics of current) of a semiconductor having the "safe" trap exhibits at least two kinds of modes ($\tau_1$ and $\tau_2$).

One embodiment of the present invention disclosed in this specification is a transistor including an oxide semiconductor layer; a source electrode layer and a drain electrode layer overlapping with part of the oxide semiconductor layer; a gate insulating layer overlapping with the oxide semiconductor layer, the source electrode layer, and the drain electrode layer; and a gate electrode overlapping with part of the oxide semiconductor layer with the gate insulating layer provided therebetween, wherein, after the oxide semiconductor layer which is to be a channel formation region is irradiated with light and the light irradiation is stopped, a relaxation time of carriers in photoresponse characteristics of the oxide semiconductor layer has at least two kinds of modes: $\tau_1$ and $\tau_2$, $\tau_1 < \tau_2$ is satisfied, and $\tau_2$ is 300 seconds or less.

Another embodiment of the present invention disclosed in this specification is a semiconductor device including a transistor wherein, after an oxide semiconductor layer which is to be a channel formation region is irradiated with light and the light irradiation is stopped, a relaxation time of carriers in photoresponse characteristics of the oxide semiconductor layer has at least two kinds of modes: $\tau_1$ and $\tau_2$, $\tau_1 < \tau_2$ is satisfied, and $\tau_2$ is 300 seconds or less.

The existence of the two kinds of modes ($\tau_1$ and $\tau_2$) of the relaxation time in photoresponse characteristics can be confirmed by the existence of two regions in results of changes in photoelectric current over time, that is, a region where the current value falls rapidly and a region where the current value falls slowly, when the average time $\tau_1$ taken for trapping of carriers by "safe" traps is long enough.

Considering the "safe" trap, the current formula after $\tau_1$ is expressed by Formula 9. Note that $\tau_2$ represents an average time during which carriers stay at the "safe" trap.

$$I(t) = A\tau_p\left(\frac{D_e}{D_h} \cdot \frac{\tau_2}{\tau_1}\right)\exp\left(-\frac{t}{\tau_2}\right)(t \geq \tau_1) \quad \text{[Formula 9]}$$

A: constant depending on physical property or temperature
$D_e$, $D_h$: diffusion coefficient of electron and diffusion coefficient of hole
$\tau_p$: relaxation time of hole in thermal equilibrium According to one embodiment of the present invention, it is possible to provide a transistor which hardly deteriorates owing to light irradiation and has stable electrical characteristics and a semiconductor device including the transistor.

BRIEF DESCRIPTION OF THE DRAWINGS

FIGS. 3A and 3B are schematic diagrams of a "safe" trap.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

(Embodiment 1)

In this embodiment, photoresponse characteristics of elements each including an oxide semiconductor will be described.

Figure 7A:
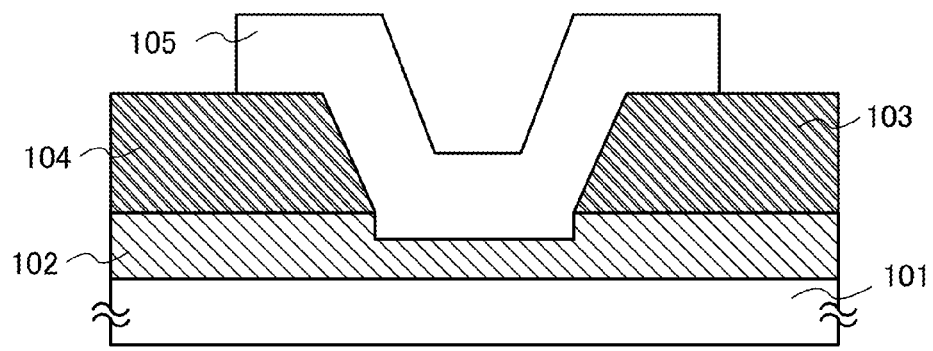
FIGS. 7A and 7B are a cross-sectional view and a top view illustrating an element.
Figure 7B:
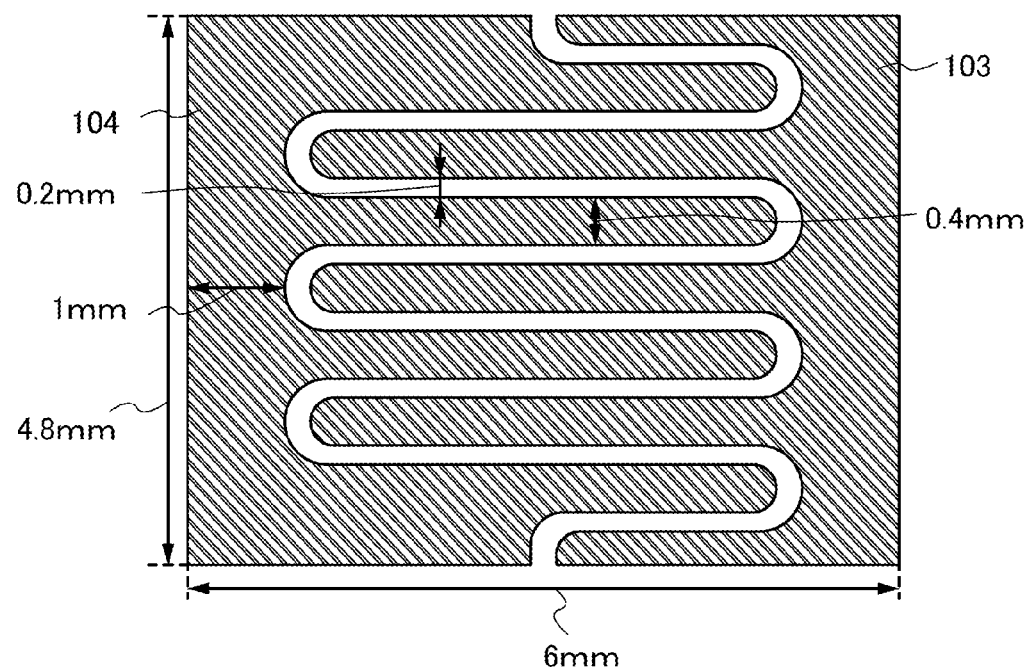

First, each of the elements having a structure illustrated in FIGS. 7A and 7B is manufactured in order to evaluate a single film of an oxide semiconductor. FIG. 7A is a cross-sectional view of the element in which an oxide semiconductor film 102, a first electrode 103, and a second electrode 104 are formed over a glass substrate 101. In addition, an insulating layer 105 is formed over the oxide semiconductor film 102, thereby suppressing variation in electrical characteristics of the oxide semiconductor film 102 due to being in contact with the outside air for a long time. FIG. 7B illustrates a top surface shape of the element including the first electrode 103 and the second electrode 104 in a region of 4.8 mm×6 mm, and a regular gap is provided between the first electrode 103 and the second electrode 104. The width of the gap is 0.2 mm, the length is 32.7 mm, and the thickness of the oxide semiconductor film 102 formed in a region under the gap is 25 nm. In addition, the thickness of the oxide semiconductor film 102 in the other region is 50 nm.

A method for manufacturing each element is as follows.

First, an In—Ga—Zn—O film with a thickness of 50 nm is formed as the oxide semiconductor film 102 over a glass substrate (126.6 mm×126.6 mm). The In—Ga—Zn—O film is formed by a sputtering method using an oxide target having a composition ratio of $In_2O_3$:$Ga_2O_3$:$ZnO$=1:1:1 [molar ratio]. Conditions for the film formation are as follows: the temperature of the film formation is room temperature, the flow rate of argon is 10 sccm, the flow rate of oxygen is 5 sccm, the pressure is 0.4 Pa, and the power is 500 W.

Then, heat treatment is performed at 450° C. for 1 hour in a nitrogen atmosphere. This heat treatment is performed in an atmosphere of an inert gas such as nitrogen, helium, neon, or argon, which does not contain water, hydrogen, or the like. Here, the dew point of the atmosphere gas is preferably −40° C. or lower, more preferably −60° C. or lower. In addition, an inert gas such as nitrogen, helium, neon, or argon which is introduced into a heat treatment apparatus preferably has a purity of 6N (99.9999%) or higher, more preferably 7N (99.99999%) or higher (that is, the concentration of impurities is 1 ppm or lower, preferably 0.1 ppm or lower).

After the heat treatment, a layered conductive film is formed by stacking a titanium nitride film with a thickness of 50 nm, a titanium film with a thickness of 50 nm, an aluminum film with a thickness of 200 nm, and a titanium film with a thickness of 50 nm by a sputtering method.

A resist mask is formed over the layered conductive film through a photolithography step, and etching is performed selectively to form the first electrode 103 and the second electrode 104. After that, $O_2$ ashing is performed and the resist mask is removed. By this etching step, a region of the oxide semiconductor film 102 where the conductive film is removed is also etched, but the etching time is adjusted so that the thickness of the region is 25 nm.

Next, by a sputtering method using a silicon oxide target, a silicon oxide film with a thickness of 300 nm is formed over the oxide semiconductor film 102, the first electrode 103, and the second electrode 104.

Then, a resist mask is formed over the silicon oxide film through a photolithography step, and etching is performed selectively to form the insulating layer 105. After that, heat treatment is performed at 250° C. for 1 hour in a nitrogen atmosphere, so that the element is completed.

Next, results of examination of photoresponse characteristics of the elements will be described. Note that the number of the elements prepared is three and light irradiation is performed while heating the elements at respective temperatures of 25° C., 85° C., and 150° C. Behaviors of current values before and after the light irradiation are examined.

Figure 1:
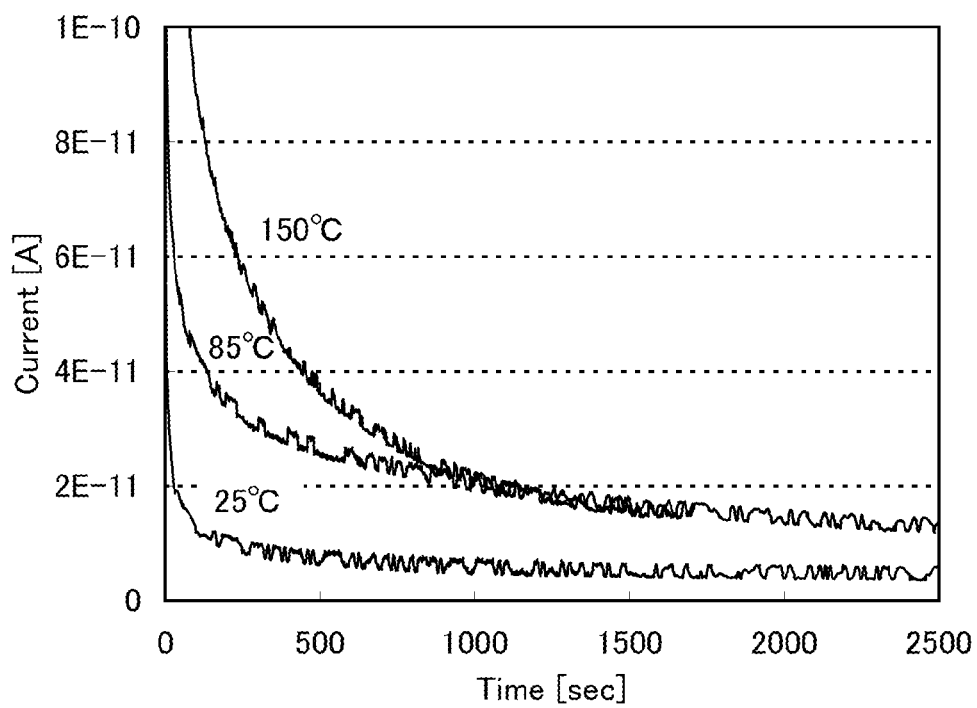
FIG. 1 is a graph showing photoresponse characteristics of an oxide semiconductor.
Figure 2:
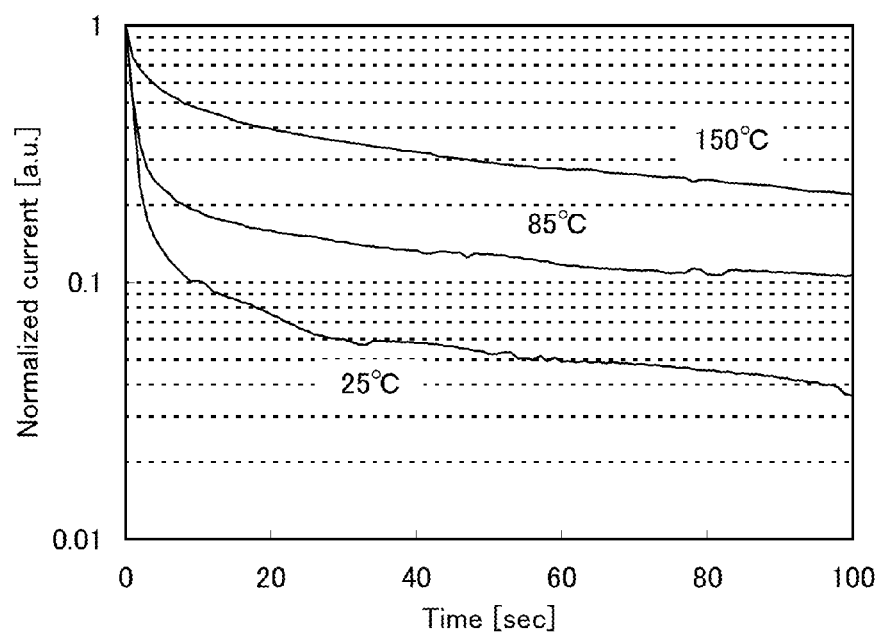
FIG. 2 is a graph in which a region in the range of 0 sec to 100 sec in FIG. 1 is enlarged.
Figure 9:
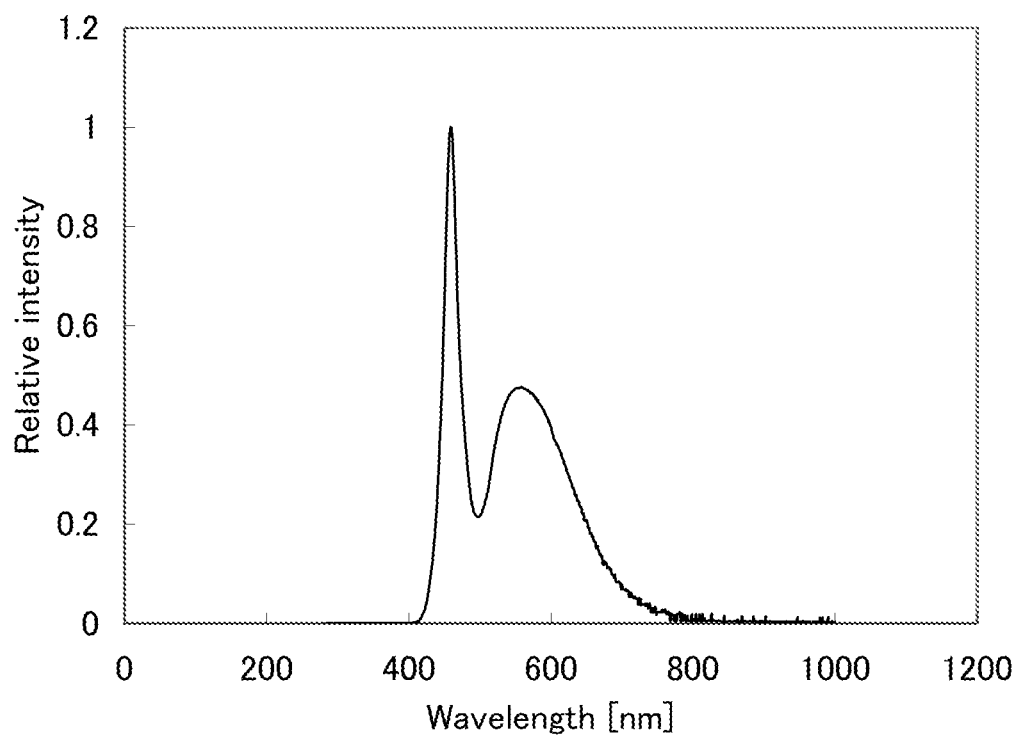
FIG. 9 is a graph showing a wavelength spectrum of a white LED.

As a light source of the light with which the oxide semiconductor film 102 is irradiated, a white LED (MDBL-CW100 produced by Moritex Corporation) is used. The wavelength spectrum of this white LED is shown in FIG. 9. Irradiation with this white light at 17000 cd/cm² is performed for 600 seconds. Then, the time when this light source is turned off is set at 0, and current values are measured. FIG. 1 is a graph showing the photoresponse characteristics. In FIG. 1, the horizontal axis indicates time and the vertical axis indicates a current value. FIG. 2 is a graph in which a region in the range of 0 sec to 100 sec in FIG. 1 is enlarged, the current value is normalized, and the vertical axis is a log scale.

Figure 6:
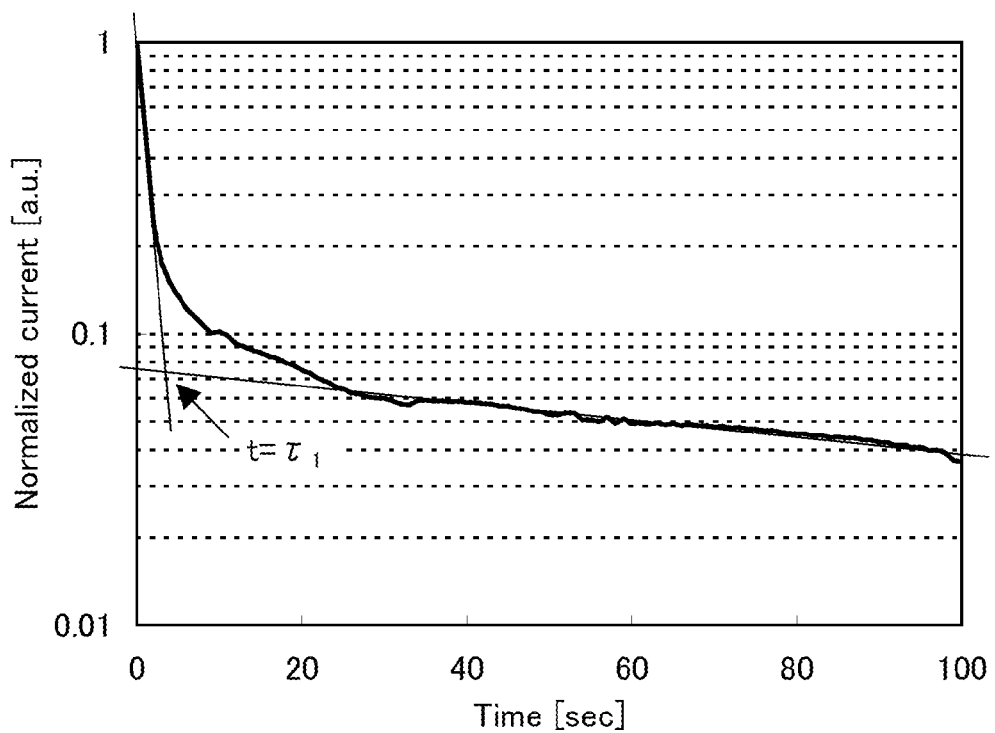
FIG. 6 is a graph showing a method for estimating $\tau_1$.

Here, it is found that the graph of the photoresponse characteristics has a time ($\tau_1$) during which photoelectric current is reduced rapidly and a time ($\tau_2$) during which the photoelectric current is reduced slowly afterwards. As shown in FIG. 6, $\tau_1$ is estimated with the intersection point of the inclination of the rapidly reduced photoelectric current and the inclination of the photoelectric current in $\tau_2$. In addition, $\tau_2$ is estimated with the current formula expressed by Formula 9.

Note that $\tau_1$ is calculated with the inclination between time 0 [sec] and time 1 [sec]. This is because the temporal resolution is 1 [sec] at measurement of current in order to increase the accuracy of the measurement. Thus, sharpness around time 0 [sec] right after the light source is turned off cannot be correctly measured, and $\tau_1$ might be estimated to be larger than the real value. Table 1 shows $\tau_1$ and $\tau_2$ at each of the temperatures.

TABLE 1

|  | 25° C. | 85° C. | 150° C. |
| --- | --- | --- | --- |
| $\tau_1$ [sec] | 2.3 | 1.6 | 1.5 |
| $\tau_2$ [sec] | 350 | 480 | 340 |

Considering the temporal resolution at the measurement, $\tau_1$ can be regarded as being substantially the same among the temperatures and $\tau_2$ can be regarded as being substantially the same among the temperatures. The above results can also be led by dependence of $\tau_1$ and $\tau_2$ on the density of traps. Meanwhile, FIG. 2 indicates that the ratio of a current value after a sufficient time passes after light irradiation is stopped (for example, time 60 [sec]) with respect to a current value right after the light irradiation is stopped (time 0 [sec]) is larger as the temperature is higher. This is because the probability of repeated thermal excitation from the traps is higher as the temperature is higher.

The reason why the graph of the photoresponse characteristics has such inclination in two stages with respect to the time axis is that "safe" traps exist close to a conduction band or a valence band.

Next, photoresponse characteristics of transistors each including an oxide semiconductor layer which is similar to the oxide semiconductor layer in the above element will be described.

Figure 4A:
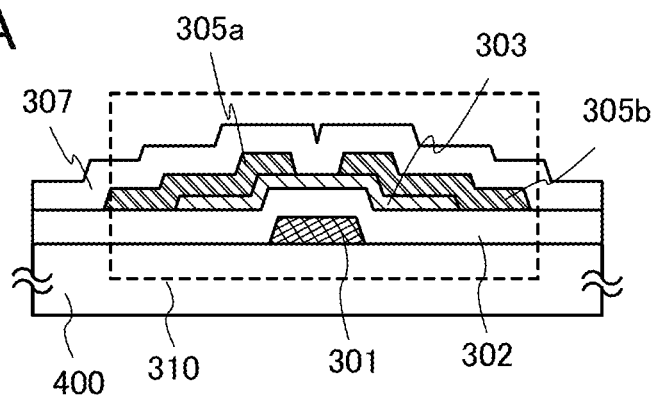
FIGS. 4A and 4B are cross-sectional views each illustrating a structure of a transistor.
Figure 4B:
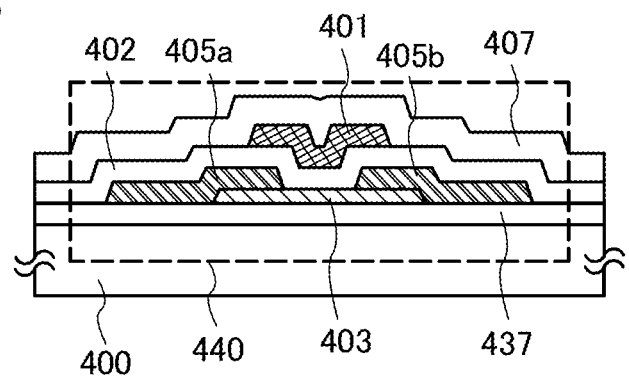

Structures of the transistors used for comparison of photoresponse characteristics are of two kinds: a bottom-gate structure illustrated in FIG. 4A and a top-gate structure illustrated in FIG. 4B. Another bottom-gate transistor without heat treatment of an oxide semiconductor layer, which is described below, is also prepared. Thus, photoresponse characteristics of three transistors in total are compared.

A transistor 310 illustrated in FIG. 4A is a bottom-gate transistor. The transistor 310 includes, over a substrate 400 having an insulating surface, a gate electrode layer 301, a gate insulating layer 302, an oxide semiconductor layer 303, a source electrode layer 305a, and a drain electrode layer 305b. The transistor 310 is covered with an insulating layer 307 which is in contact with the oxide semiconductor layer 303. In this embodiment, a tungsten layer with a thickness of 100 nm is used as the gate electrode layer 301; a silicon oxynitride layer with a thickness of 100 nm formed by a high density plasma CVD method is used as the gate insulating layer 302; an In—Ga—Zn—O film with a thickness of 25 nm is used as the oxide semiconductor layer 303; a stack of a titanium layer with a thickness of 100 nm, an aluminum layer with a thickness of 200 nm, and a titanium layer with a thickness of 100 nm is used as the source electrode layer 305a and the drain electrode layer 305b; and a silicon oxide layer with a thickness of 300 nm is used as the insulating layer 307.

A transistor 440 illustrated in FIG. 4B is a top-gate transistor. The transistor 440 includes, over the substrate 400 having an insulating surface, an insulating layer 437, an oxide semiconductor layer 403, a source electrode layer 405a, a drain electrode layer 405b, a gate insulating layer 402, and a gate electrode layer 401. The transistor 440 is covered with an insulating layer 407. In this embodiment, a silicon oxide layer with a thickness of 300 nm is used as the insulating layer 437; an In—Ga—Zn—O film with a thickness of 30 nm is used as the oxide semiconductor layer 403; a tungsten layer with a thickness of 100 nm is used as the source electrode layer 405a and the drain electrode layer 405b; a silicon oxynitride layer with a thickness of 100 nm formed by a plasma CVD method is used as the gate insulating layer 402; a stack of a tantalum nitride layer with a thickness of 30 nm and a tungsten layer with a thickness of 370 nm is used as the gate electrode layer 401; and a silicon oxide layer with a thickness of 300 nm is used as the insulating layer 407.

Although not illustrated, a protective insulating layer may be formed over the insulating layer 307 of the transistor 310 and the insulating layer 407 of the transistor 440.

Further, the transistor may have a single gate structure including one channel formation region or a multi-gate structure such as a double gate structure including two channel formation regions or a triple gate structure including three channel formation regions. Furthermore, the transistor may have a dual gate structure including two gate electrode layers positioned over and below a channel region with a gate insulating layer provided therebetween.

In this embodiment, the size of the transistors is as follows regardless of the structure. The channel length is 3 μm, and the channel width is 50 μm.

Next, with reference to FIGS. 5A to 5D, an example of a method for manufacturing the transistor 440 will be described. Note that the transistor 310 can be manufactured using similar material and method.

First, the insulating layer 437 which serves as a base film is formed over the substrate 400 having an insulating surface. The insulating layer 437 has a function of preventing impurity elements in the substrate 400 from diffusing and can be formed using silicon nitride film, a silicon oxide film, a silicon nitride oxide film, a silicon oxynitride film, or a film of aluminum oxide, gallium oxide, or gallium aluminum oxide represented by $Ga_xAl_{2-x}O_{3+y}$, ($0 \le x \le 2$, $y>0$, x is greater than or equal to 0 and less than or equal to 2, and y is greater than 0). The structure of the base film is not limited to a single-layer structure, and may be a layered structure of a plurality of the above films.

Here, a substrate having heat resistance enough to withstand at least heat treatment performed later can be used as the substrate 400. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate made of silicon, silicon carbide, or the like; a compound semiconductor substrate made of silicon germanium or the like; an SOI substrate; or the like may be used as the substrate 400.

A flexible substrate may be used as the substrate 400. In the case where a flexible substrate is used, the following methods can be given, and either of them may be used: a method in which a transistor including an oxide semiconductor layer is directly formed over a flexible substrate; and a method in which a transistor including an oxide semiconductor layer is formed over another substrate and is transferred to a flexible substrate. In the case where the method in which the transistor is transferred to a flexible substrate is employed, the substrate over which the transistor is formed may be provided with a separation layer.

Next, an oxide semiconductor film having a thickness of greater than or equal to 2 nm and less than or equal to 200 nm, preferably greater than or equal to 5 nm and less than or equal to 30 nm is formed over the insulating layer 437.

An oxide semiconductor used for the oxide semiconductor film includes at least one element selected from In, Ga, Sn, Zn, Al, Mg, Hf, and lanthanoid. For example, any of the following oxide semiconductors can be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Hf—Zn—O-based oxide semiconductor, an In—La—Zn—O-based oxide semiconductor, an In—Ce—Zn—O-based oxide semiconductor, an In—Pr—Zn—O-based oxide semiconductor, an In—Nd—Zn—O-based oxide semiconductor, an In—Pm—Zn—O-based oxide semiconductor, an In—Sm—Zn—O-based oxide semiconductor, an In—Eu—Zn—O-based oxide semiconductor, an In—Gd—Zn—O-based oxide semiconductor, an In—Tb—Zn—O-based oxide semiconductor, an In—Dy—Zn—O-based oxide semiconductor, an In—Ho—Zn—O-based oxide semiconductor, an In—Er—Zn—O-based oxide semiconductor, an In—Tm—Zn—O-based oxide semiconductor, an In—Yb—Zn—O-based oxide semiconductor, or an In—Lu—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; an In—O-based oxide semiconductor; a Sn—O-based oxide semiconductor; a Zn—O-based oxide semiconductor; and the like. Further, $SiO_2$ may be contained in the above oxide semiconductor. Here, an In—Ga—Zn—O-based oxide semiconductor means an oxide containing indium (In), gallium (Ga), and zinc (Zn), and there is no particular limitation on the composition ratio thereof. Further, the In—Ga—Zn—O-based oxide semiconductor may contain an element other than In, Ga, and Zn.

As the oxide semiconductor film, a film of a material represented by a chemical formula $InMO_3(ZnO)_m$ (m>0) can be used. Here, M represents one or more metal elements selected from Zn, Ga, Al, Mn, and Co. Specifically, M may be Ga, Ga and Al, Ga and Mn, Ga and Co, or the like.

In particular, when an oxide semiconductor containing indium, an oxide semiconductor containing indium and gallium, or the like is used, a transistor having favorable electrical characteristics can be formed. In this embodiment, an In—Ga—Zn—O film is formed as the oxide semiconductor film by a sputtering method.

As the target used for the sputtering method, an oxide target having a composition ratio of $In_2O_3:Ga_2O_3:ZnO$=1:1:1 [molar ratio] is used. Alternatively, an oxide target having a composition ratio of $In_2O_3:Ga_2O_3:ZnO$=1:1:2 [molar ratio] may be used.

In the case where an In—Zn—O-based material is used as an oxide semiconductor, a target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=1.5:1 to 15:1 in an atomic ratio ($In_2O_3$:ZnO=3:4 to 15:2 in a molar ratio). For example, in a target used for formation of an In—Zn—O-based oxide semiconductor which has an atomic ratio of In:Zn:O=X:Y:Z, the relation of Z>1.5X+Y is satisfied.

The filling rate of the target is higher than or equal to 90% and lower than or equal to 100%, preferably higher than or equal to 95% and lower than or equal to 100%. With the use of the target with high filling rate, a dense oxide semiconductor film can be formed.

As the sputtering gas, a rare gas (typically argon), oxygen, or a mixed gas of a rare gas and oxygen can be used. It is preferable to use a high-purity gas from which impurities such as hydrogen, water, a hydroxyl group, and hydride are removed as the sputtering gas.

The oxide semiconductor film is preferably formed while the substrate is heated. The substrate is held in a deposition chamber kept under reduced pressure, and deposition is performed in the state where the substrate temperature is set to a temperature higher than or equal to 100° C. and lower than or equal to 600° C., preferably higher than or equal to 200° C. and lower than or equal to 400° C.; thus, the impurity concentration in the oxide semiconductor film can be reduced.

In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is exhausted with a cryopump, a hydrogen atom, a compound containing a hydrogen atom such as water, a compound containing a carbon atom, and the like are exhausted, whereby the impurity concentration in the oxide semiconductor film formed in the deposition chamber can be reduced.

As one example of conditions for the film formation, the following is given: the distance between the substrate and the target is 100 mm, the pressure is 0.6 Pa, the direct-current (DC) power is 0.5 kW, and the atmosphere is an oxygen atmosphere (the proportion of the oxygen flow rate is 100%). When a pulsed direct-current power source is used, powder substances (also referred to as particles or dust) that are generated in deposition can be reduced and the film thickness can be uniform.

Figure 5A:
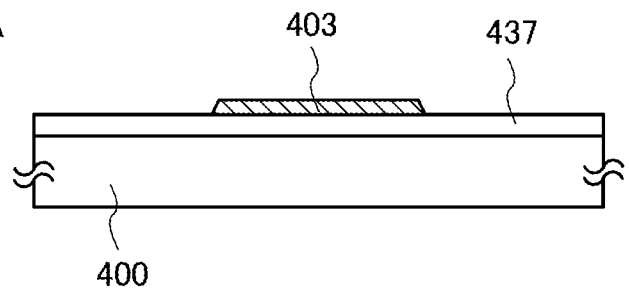
FIGS. 5A to 5D are cross-sectional views illustrating a process for manufacturing a transistor.
Figure 5B:
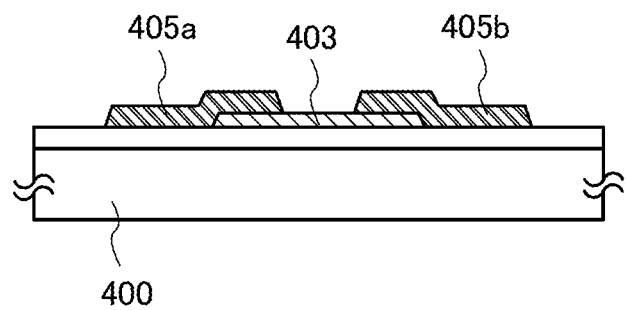

Next, by performance of a first photolithography step and an etching step, the oxide semiconductor film is processed into an island-shaped oxide semiconductor layer 403 (see FIG. 5A).

Note that a resist mask used in the photolithography step may be formed by an inkjet method. Formation of the resist mask by an inkjet method needs no photomask; thus, manufacturing cost can be reduced.

Here, the etching of the oxide semiconductor film may be either dry etching or wet etching. Alternatively, both of them may be used. As an etchant used for wet etching of the oxide semiconductor film, for example, a mixed solution of phosphoric acid, acetic acid, and nitric acid, or the like can be used. Alternatively, ITO-07N (produced by KANTO CHEMICAL CO., INC.) may be used.

Next, dehydration or dehydrogenation of the oxide semiconductor layer 403 is performed through heat treatment. In this specification, the term "dehydration or dehydrogenation" refers to not only elimination of water or a hydrogen molecule but also elimination of a hydrogen atom, a hydroxyl group, or the like.

Through this heat treatment, excessive hydrogen (including water and a hydroxyl group) is removed and a structure of the oxide semiconductor layer is improved, resulting in less impurity levels in an energy gap. The temperature of the heat treatment is higher than or equal to 250° C. and lower than or equal to 650° C., preferably higher than or equal to 350° C. and lower than or equal to 500° C., more preferably higher than or equal to 390° C. and lower than or equal to 460° C. Note that the length of time of the heat treatment may be about 1 hour as long as the temperature is in the above favorable range. The heat treatment may be performed through rapid thermal annealing (RTA) treatment in an atmosphere of an inert gas (such as nitrogen, helium, neon, or argon) at a temperature of higher than or equal to 500° C. and lower than or equal to 750° C. (or a temperature lower than or equal to the strain point of the glass substrate) for approximately more than or equal to 1 minute and less than or equal to 10 minutes, preferably at 650° C. for approximately more than or equal to 3 minutes and less than or equal to 6 minutes. A method for the heat treatment may be determined by the practitioner as appropriate. Note that the timing of heat treatment for the dehydration or dehydrogenation of the oxide semiconductor layer 403 is not limited to this timing and may be performed plural times, for example, before and after a photolithography step or a film formation process. In that case, heat treatment in an atmosphere containing oxygen may be performed.

The heat treatment performed on the oxide semiconductor may be performed on the oxide semiconductor film which has not yet been processed into the island-shaped oxide semiconductor layer. In that case, after the heat treatment, a photolithography step is performed. The heat treatment may be performed after the source electrode layer and the drain electrode layer are formed over the island-shaped oxide semiconductor layer as long as the oxide semiconductor is deposited.

Next, a conductive film to be a source electrode layer and a drain electrode layer (including a wiring formed in the same layer as the source electrode layer and the drain electrode layer) is formed over the insulating layer 437 and the oxide semiconductor layer 403. As the conductive film serving as the source electrode layer and the drain electrode layer, for example, a metal film containing an element selected from aluminum, chromium, copper, tantalum, titanium, molybdenum, or tungsten, or a metal nitride film containing any of the above elements as its component (e.g., a titanium nitride film, a molybdenum nitride film, or a tungsten nitride film) can be used. Alternatively, a film of a high-melting-point metal such as titanium, molybdenum, or tungsten or a nitride film of any of them (e.g., a titanium nitride film, a molybdenum nitride film, or a tungsten nitride film) may be provided on one surface or both surfaces of a metal film such as an aluminum film or a copper film to form the conductive film serving as the source electrode layer and the drain electrode layer.

Alternatively, the conductive film serving as the source electrode layer and the drain electrode layer may be formed using a conductive metal oxide. As the conductive metal oxide, indium oxide ($In_2O_3$), tin oxide ($SnO_2$), zinc oxide (ZnO), indium tin oxide ($In_2O_3$—$SaO_2$; abbreviated to ITO), indium zinc oxide ($In_2O_3$—ZnO), or any of these metal oxide materials in which silicon oxide is contained can be used.

Next, a resist mask is formed over the conductive film in a second photolithography step and selective etching is performed, so that the source electrode layer 405a and the drain electrode layer 405b are formed. Then, the resist mask is removed (see FIG. 5B).

Note that the etching of the conductive film is performed so that the oxide semiconductor layer 403 is not etched as much as possible. However, it is difficult to obtain etching conditions under which only the conductive film is etched. In some cases, the oxide semiconductor layer 403 is partly etched so as to have a groove portion (a recessed portion) by the etching of the conductive film.

In this embodiment, a titanium film is used as the conductive film and an In—Ga—Zn—O-based oxide semiconductor is used as the oxide semiconductor layer 403, and therefore, the conductive film is selectively etched by using ammonium hydrogen peroxide (a mixture of ammonia, water, and hydrogen peroxide) as an etchant.

Figure 5C:
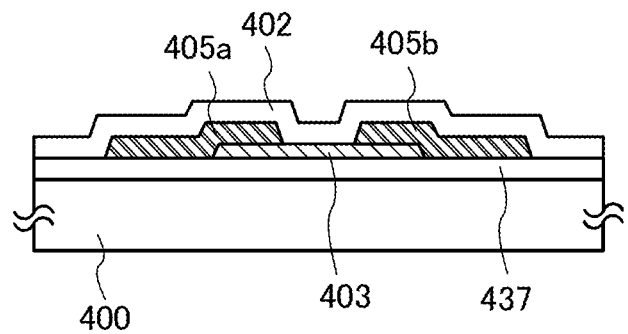

Next, the gate insulating layer 402 is formed over the source electrode layer 405a, the drain electrode layer 405b, and the oxide semiconductor layer 403 (see FIG. 5C). The gate insulating layer 402 can be formed using any of silicon oxide, silicon nitride, silicon oxynitride, silicon nitride oxide, aluminum oxide, aluminum nitride, aluminum oxynitride, aluminum nitride oxide, hafnium oxide, and gallium oxide, or a mixed material thereof by a plasma CVD method, a sputtering method, or the like. The structure of the gate insulating layer 402 is not limited to a single-layer structure, and may be a layered structure of a plurality of the above materials.

It is preferable that an insulating material containing the same kind of component as the oxide semiconductor layer be used for the gate insulating layer 402. Such a material enables the state of the interface with the oxide semiconductor layer to be kept well. Here, containing "the same kind of component as the oxide semiconductor layer" means containing one or more elements selected from constituent elements of the oxide semiconductor layer. For example, in the case where the oxide semiconductor layer is formed using an In—Ga—Zn—O-based oxide semiconductor material, gallium oxide or the like is given as such an insulating material containing the same kind of component as the oxide semiconductor layer.

For formation of the gate insulating layer 402, it is preferable to employ a high density plasma CVD method using microwaves (for example, with a frequency of 2.45 GHz) by which a high-quality insulating layer which is dense and has high withstand voltage can be formed. The oxide semiconductor layer is formed in close contact with the high-quality gate insulating layer, whereby interface state density at the interface can be reduced.

Moreover, it is possible to use as the gate insulating layer an insulating layer whose quality and characteristics of the interface with the oxide semiconductor layer are improved by heat treatment performed after the formation of the insulating layer. In any case, the gate insulating layer 402 is preferably formed using an insulating layer that can reduce the interface state density with the oxide semiconductor layer to form a favorable interface, as well as having favorable film quality.

Figure 5D:
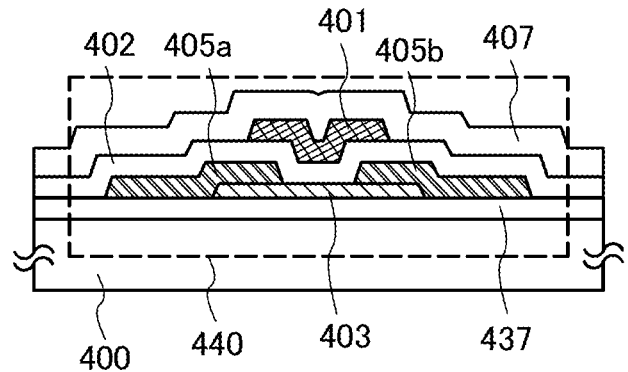

Next, after the conductive film is formed, the gate electrode layer 401 is formed through a third photolithography step and an etching step (see FIG. 5D).

The gate electrode layer 401 can be formed using a metal material such as molybdenum, titanium, tantalum, tungsten, aluminum, copper, neodymium, or scandium, or an alloy material which includes any of these metal materials as a main component by a sputtering method or the like. The structure of the gate electrode layer 401 is not limited to a single-layer structure, and may be a layered structure of a plurality of the above materials.

Next, an insulating film is formed as the insulating layer 407. As the insulating film, an inorganic insulating film such as a silicon oxide film, a silicon oxynitride film, an aluminum oxide film, an aluminum oxynitride film, or a gallium oxide film or a gallium aluminum oxide film represented by $Ga_xAl_{2-x}O_{3+y}$ ($0 \leq x \leq 2$, $y > 0$, x is more than or equal to 0 and less than or equal to 2, and y is more than 0) can be used.

Although not illustrated, a protective insulating layer for increasing reliability may be formed over the insulating layer 407. As the protective insulating layer, an inorganic insulating film such as a silicon nitride film, an aluminum nitride film, a silicon nitride oxide film, or an aluminum nitride oxide film can be used.

A planarization insulating film may be formed over the insulating layer 407 or the protective insulating layer in order to reduce surface roughness caused by a transistor. For the planarization insulating film, an organic material such as polyimide, acrylic, or benzocyclobutene can be used. Other than such organic materials, it is also possible to use a low dielectric constant material (a low-k material) or the like. Note that the planarization insulating film may be formed by stacking a plurality of insulating films formed from these materials.

Through the above-described process, the transistor 440 is formed.

Next, a measurement system for examination of photoresponse characteristics of the manufactured transistors will be described.

Figure 8:
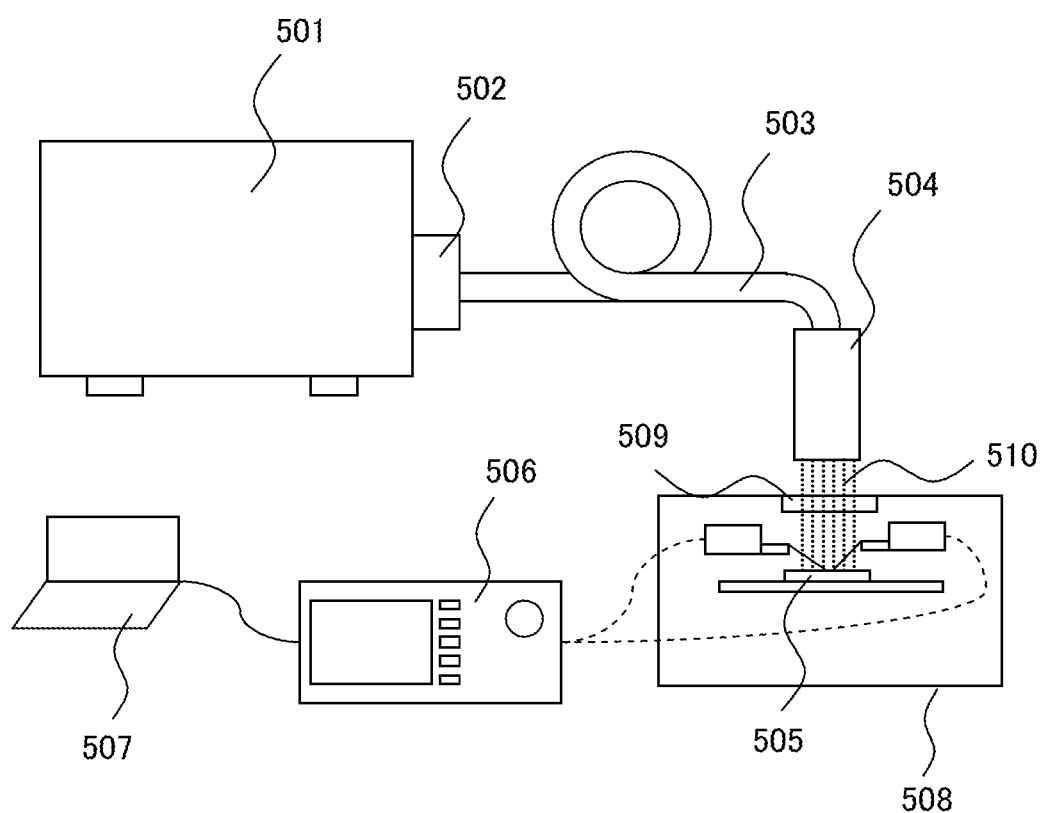
FIG. 8 is a conceptual diagram of a measurement system for examination of photoresponse characteristics.
Figure 10:
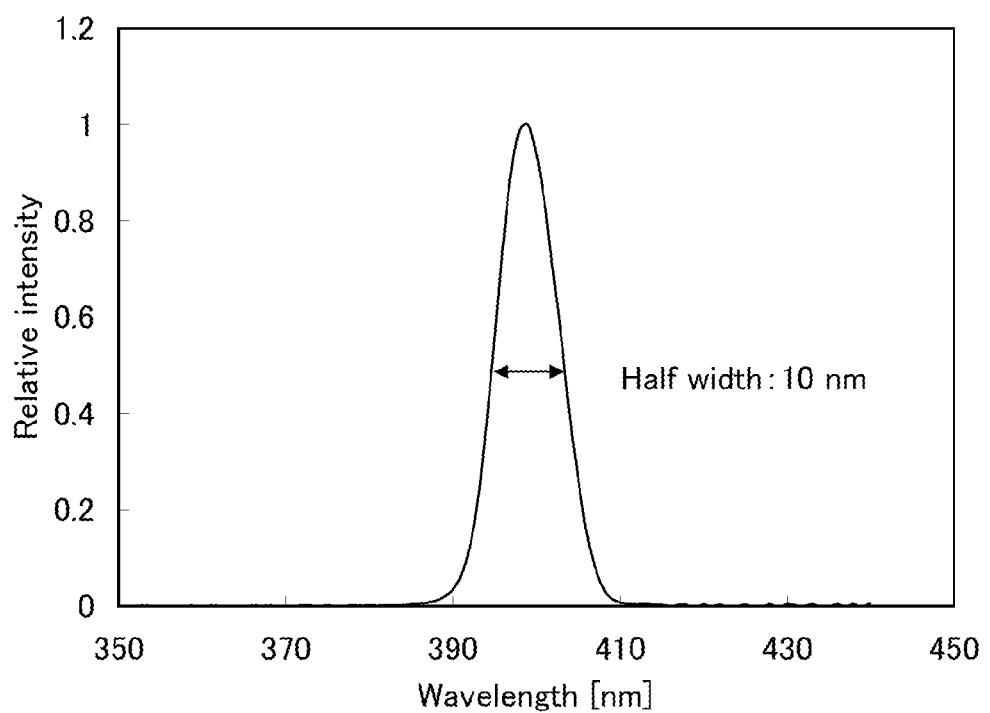
FIG. 10 is a graph showing a wavelength spectrum of light after passing through an optical filter.

A conceptual diagram of the measurement system is illustrated in FIG. 8. A transistor 505 set inside a chamber 508 is irradiated with light whose light source is a xenon lamp 501 through an optical filter 502, an optical fiber 503, a rod lens 504, and a light introducing window 509. Here, light 510 for irradiation is spectrally distributed to have a central wavelength of 400 nm (half width: 10 nm) with the use of the optical filter 502 (see FIG. 10). As an ammeter 506, a semiconductor parameter analyzer (4155C produced by Agilent Technologies, Inc.) is used, and changes in photoelectric current output from the transistor 505 is measured over time and output to a personal computer 507.

At the time of measurement of photoelectric current, the drain voltage of the transistor is 0.1 V, the gate voltage is 0 V, the sampling interval of the semiconductor parameter analyzer is 1 second, the number of times of sampling is 3601 (per 1 hour), and the integral action time is "medium" (1 second).

As described above, three types of transistors are used for the measurement, and one (hereinafter referred to as Bottom-gate 1) of the bottom-gate transistors is a transistor which is not subjected to heat treatment for the dehydration or dehydrogenation of the oxide semiconductor layer in the above-described process for manufacturing the transistor. The other one (hereinafter referred to as Bottom-gate 2) of the bottom-gate transistors and the top-gate transistor (hereinafter referred to as Top-gate) are subjected to heat treatment in which an RTA treatment at 650° C. and a heating step at 450° C. in a dry air are performed.

Figure 11:
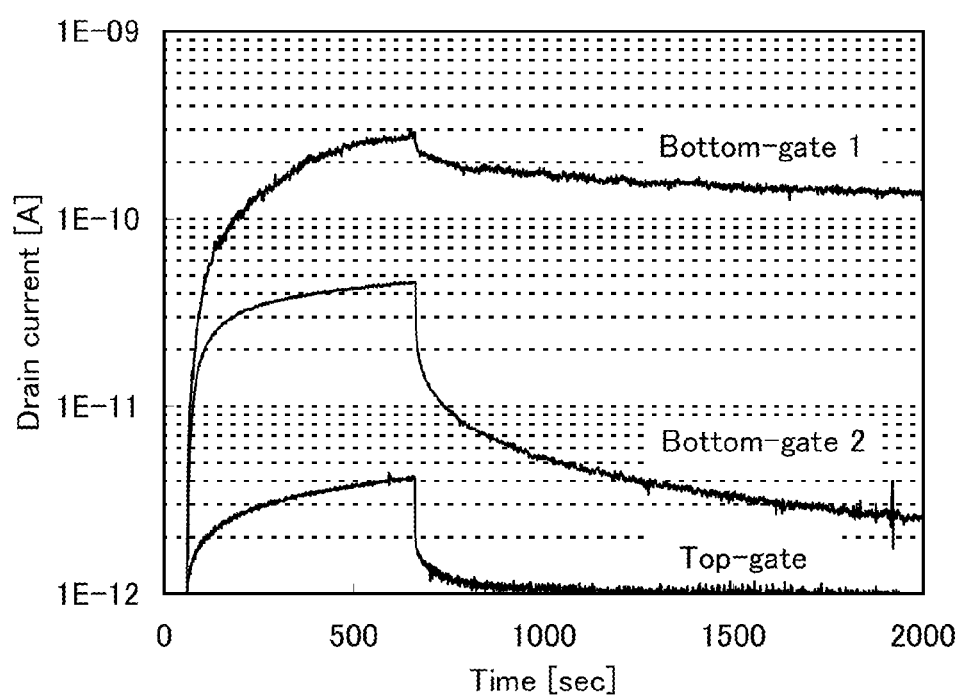
FIG. 11 is a graph showing photoresponse characteristics of transistors.
Figure 12:
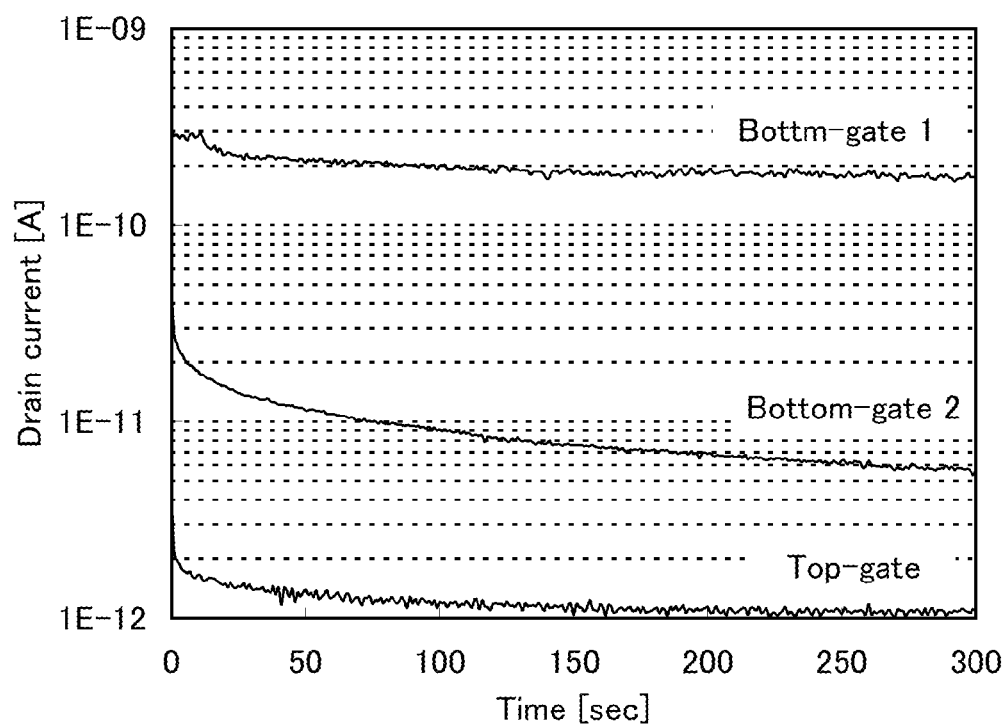
FIG. 12 is a graph in which a region in the range of 0 sec to 300 sec in FIG. 11 is enlarged.

FIG. 11 shows current-time (I-t) characteristics of the three transistors when irradiation with light having a central wavelength of 400 nm with an irradiation intensity of 3.5 mW/cm$^2$ is performed for 600 seconds. FIG. 12 shows an enlarged graph of a region where current falls after the light irradiation. Note that the light irradiation is performed so that a channel formation region is irradiated with light; thus, for the bottom-gate transistors, light was emitted from sides provided with the transistors, and for the top-gate transistor, light was emitted from the substrate side.

Bottom-gate 1 has the largest maximum value of photoelectric current ($I_{max}$) right before the light irradiation is stopped, followed by Bottom-gate 2 and Top-gate. Bottom-gate 1 and Bottom-gate 2 are different from each other in that heat treatment for the dehydration or dehydrogenation is performed or not; thus, it is indicated that a transistor including a highly purified oxide semiconductor layer has a small number of levels which generate photoelectric current. In addition, Top-gate has not only a small $I_{max}$ but also high photoresponse speed. It is found that the current value converges within approximately 300 seconds after light irradiation is stopped. Table 2 shows $\tau_1$ and $\tau_2$ of each of the transistors.

TABLE 2

|  | $I_{max}$ [A] | $\tau_1$ [sec] | $\tau_2$ [sec] |
| --- | --- | --- | --- |
| Bottom-gate 1 | 3.20E−10 | 6.1 | 3821 |
| Bottom-gate 2 | 9.00E−11 | 3.8 | 1253 |
| Top-gate | 5.00E−12 | 2.1 | — |

Figure 13:
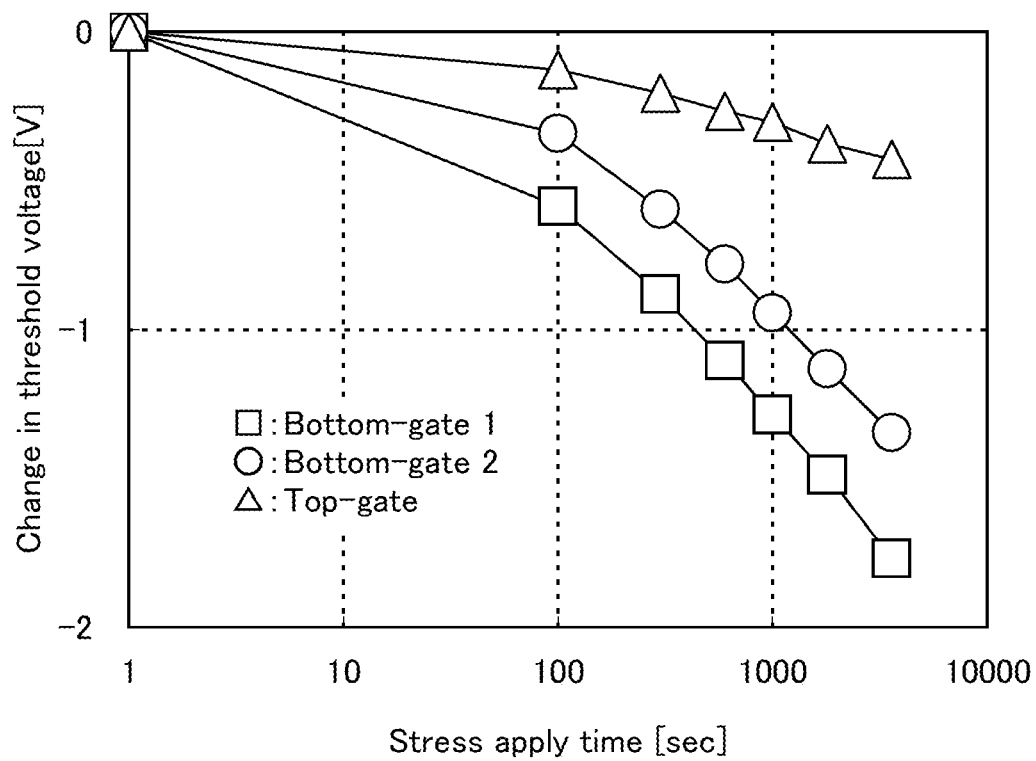
FIG. 13 is a graph showing changes in threshold voltages of transistors after negative BT treatment under light.

FIG. 13 shows changes in threshold voltages when voltage is applied so that a stress of −2 MV/cm is applied to gates at room temperature while the transistors are irradiated with light with an illuminance of 36000 lx with the use of a white LED. Note that source and drain terminals are at GND potentials during the voltage application. Here, Top-gate has the smallest changes in threshold voltage, followed by Bottom-gate 2 and Bottom-gate 1. Similarly, Top-gate has the smallest photoelectric current values in Table 2 and the highest photoresponse speed, followed by Bottom-gate 2 and Bottom-gate 1. Therefore, a top-gate structure is suitable for a transistor including an oxide semiconductor layer in terms of reliability.

It is known that when an oxide typified by silicon oxide is irradiated with intense ultraviolet rays, electron-hole pairs are generated. In addition, it is also known, from C-t measurement under light or the like, that when an electric field is applied in the above state, electrons and holes are separated from each other to become free carriers. It is said that in silicon oxide, holes generated by light irradiation are moved very slowly and trapped by hole traps existing in the oxide film to be stable charge. An In—Ga—Zn—O film has a relatively wide band gap, which is 3.1 eV. Owing to such a structure, mobility of holes is extremely lower than that of electrons. In the above-described photoresponse characteristics, carriers are increased by irradiating the In—Ga—Zn—O film even with light having a wavelength of 400 nm, and there are a long relaxation time and a short relaxation time. These results can be seen in a quite similar manner to that in physics of silicon oxide.

Figure 14:
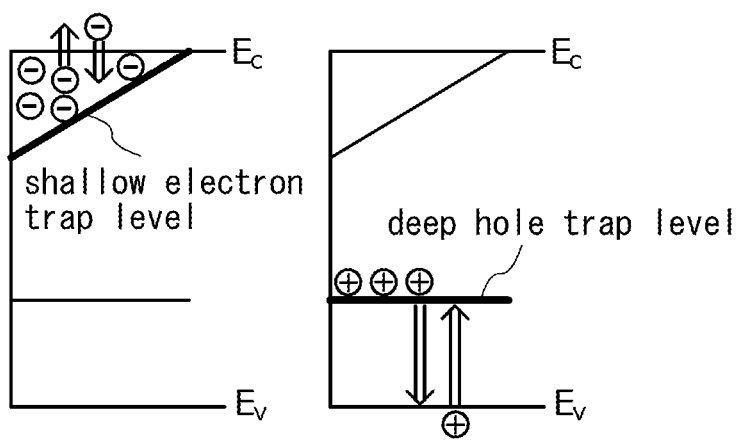
FIG. 14 is a diagram for describing band models of an In—Ga—Zn—O semiconductor.

Photoresponse characteristics of an In—Ga—Zn—O semiconductor will be discussed on the assumption that the In—Ga—Zn—O semiconductor has band models as illustrated in FIG. 14. The two-stage relaxation time of carriers, which is $\tau_1$ and $\tau_2$, is seen in the graph of the photoelectric current because there are two kinds of trap levels: an electron trap level, which is a shallow level close to a conduction band, and a hole trap level, which is a deep level close to a valence band. The former shallow electron trap level relates to the rapid response time $\tau_1$, and the latter deep hole trap level relates to the slow response time $\tau_2$. If there were only the former shallow electron trap level, a very rapid response converging in approximately several seconds would be assumed; as a result, changes in threshold voltages of transistors would not occur. Suppose the deep hole trap level exists, trapped holes do not easily return to the valence band, resulting in a very slow response. The trapped charge remains in the film as fixed charge; as a result, changes in threshold voltages of transistors occur. Therefore, a transistor including an oxide semiconductor desirably has a relaxation time in which $\tau_1 < \tau_2$ is satisfied and $\tau_2$ is short.

It is indicated that in a transistor including an oxide semiconductor layer, which is one embodiment of the present invention, the density of deep hole trap levels close to a valence band in an energy gap can be reduced depending on a structure or a process for manufacturing the transistor; therefore, it is possible to manufacture a transistor in which light deterioration is suppressed as much as possible and electrical characteristics are stable. Thus, reliability of a semiconductor device such as a display device including the transistor can be increased.

This embodiment can be implemented in appropriate combination with structures described in the other embodiment.

(Embodiment 2)

A semiconductor device disclosed in this specification can be applied to a variety of electronic devices (including amusement machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large game machine such as a pachinko machine, and the like. Examples of electronic devices each including the transistor and a semiconductor device including the transistor described in the above embodiment will be described.

Figure 15A:
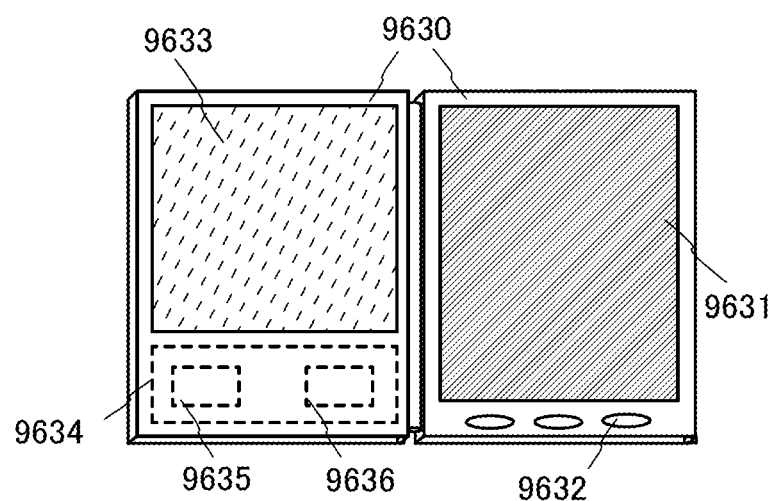
FIG. 15A illustrates an electronic device and FIG. 15B is a block diagram of the electronic device.

FIG. 15A illustrates an electronic book reader (also referred to as an e-book reader) which can include housings 9630, a display portion 9631, operation keys 9632, a solar cell 9633, and a charge and discharge control circuit 9634. The electronic book reader illustrated in FIG. 15A has a function of displaying various kinds of data (e.g., a still image, a moving image, and a text image), a function of displaying a calendar, a date, time, or the like on the display portion, a function of operating or editing the data displayed on the display portion, a function of controlling processing by various kinds of software (programs), and the like. Note that in FIG. 15A, a structure including a battery 9635 and a DCDC converter (hereinafter abbreviated as a converter) 9636 is illustrated as an example of the charge and discharge control circuit 9634. By applying the semiconductor device described in the other embodiment to the display portion 9631, the electronic book reader can be highly reliable.

In the structure of FIG. 15A, a semi-transmissive or reflective liquid crystal display device is used for the display portion 9631, whereby the electronic book reader is excellent in visibility even in a relatively bright environment. In such an environment, power generation by the solar cell 9633 and charge with the battery 9635 can be efficiently performed. Note that the solar cell 9633 can be provided in not only the illustrated region but also a space (a surface or a rear surface) of the housing 9630 as appropriate. When a lithium ion battery is used as the battery 9635, there is an advantage of downsizing or the like.

Figure 15B:
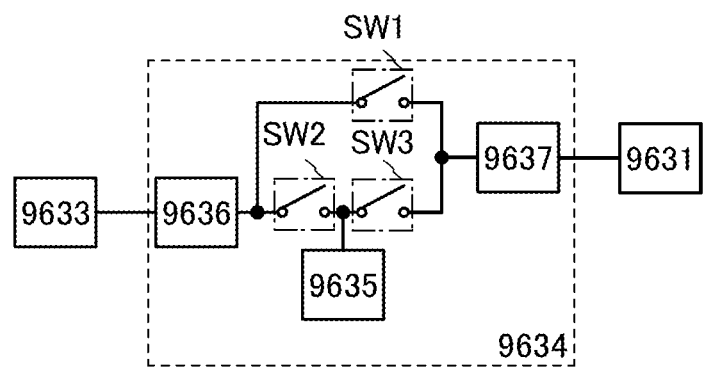

The structure and the operation of the charge and discharge control circuit 9634 illustrated in FIG. 15A will be described with reference to a block diagram in FIG. 15B. The solar cell 9633, the battery 9635, the converter 9636, a converter 9637, switches SW1 to SW3, and the display portion 9631 are shown in FIG. 15B. The battery 9635, the converter 9636, the converter 9637, and the switches SW1 to SW3 are included in the charge and discharge control circuit 9634.

First, an example of operation in the case where power is generated by the solar cell 9633 using external light is described. The voltage of power generated by the solar cell is raised or lowered by the converter 9636 to a suitable voltage for charging the battery 9635. Then, when the power from the solar cell 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and a switch SW2 is turned on so that charge of the battery 9635 may be performed.

Next, operation in the case where power is not generated by the solar cell 9633 owing to lack of external light is described. The voltage of power accumulated in the battery 9635 is raised or lowered by the converter 9637 by turning on the switch SW3. Then, power from the battery 9635 is used for the operation of the display portion 9631.

Note that the solar cell is described as one example of a means for charging, the battery 9635 may be charged with another means or with a combination of the solar cell and another means.

Figure 16A:
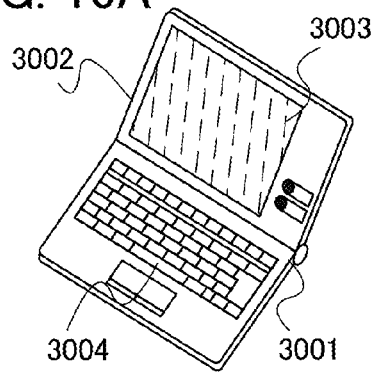
FIGS. 16A to 16F illustrate electronic devices.

FIG. 16A illustrates a laptop personal computer including a main body 3001, a housing 3002, a display portion 3003, a keyboard 3004, and the like. By applying the semiconductor device described in the other embodiment to the display portion 3003, the laptop personal computer can be highly reliable.

Figure 16B:
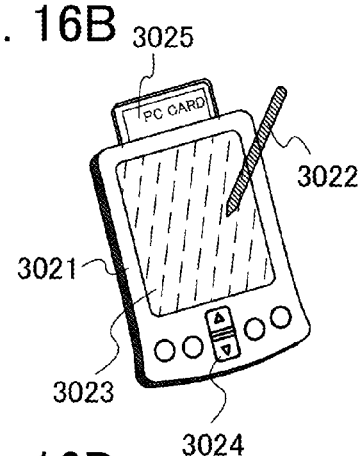

FIG. 16B illustrates a personal digital assistant (PDA) including a display portion 3023, an external interface 3025, an operation button 3024, and the like in a main body 3021. A stylus 3022 is included as an accessory for operation. By applying the semiconductor device described in the other embodiment to the display portion 3023, the personal digital assistant (PDA) can be highly reliable.

Figure 16C:
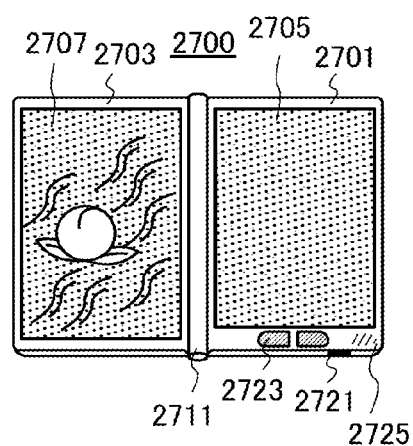

FIG. 16C illustrates an example of an electronic book reader. For example, an electronic book reader 2700 has two housings, a housing 2701 and a housing 2703. The housing 2701 and the housing 2703 are combined with a hinge 2711. The housing 2701 and the housing 2703 can be opened and closed with the hinge 2711 as an axis, and can operate like a paper book.

A display portion 2705 and a display portion 2707 are incorporated in the housing 2701 and the housing 2703, respectively. The display portion 2705 and the display portion 2707 may display one image or different images. In the structure where different images are displayed on the display portion 2705 and the display portion 2707, for example, the right display portion (the display portion 2705 in FIG. 16C) can display text and the left display portion (the display portion 2707 in FIG. 16C) can display images. By applying the semiconductor device described in the other embodiment to the display portions 2705 and 2707, the electronic book reader 2700 can be highly reliable.

FIG. 16C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Figure 16D:
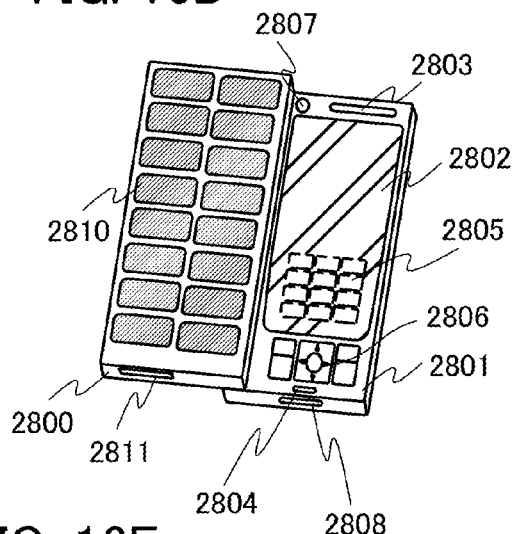

FIG. 16D illustrates a portable information terminal, which includes two housings, a housing 2800 and a housing 2801. The housing 2801 includes a display panel 2802, a speaker 2803, a microphone 2804, a pointing device 2806, a camera 2807, an external connection terminal 2808, and the like. In addition, the housing 2800 includes a solar battery 2810 having a function of charge of the portable information terminal, an external memory slot 2811, and the like. Further, an antenna is incorporated in the housing 2801. By applying the semiconductor device described in the other embodiment to the display panel 2802, the portable information terminal can be highly reliable.

Further, the display panel 2802 is provided with a touch panel. A plurality of operation keys 2805 which are displayed as images are illustrated by dashed lines in FIG. 16D. Note that a booster circuit is mounted for boosting a voltage output from the solar battery 2810 to a voltage needed for each circuit.

In the display panel 2802, the display direction can be appropriately changed depending on a usage pattern. Further, the camera 2807 is provided in the same plane as the display panel 2802, and thus the portable information terminal can be used for videophone calls. The speaker and the microphone 2804 can be used for voice recording, playback, and the like as well as voice calls. Furthermore, the housings 2800 and 2801 which are developed as illustrated in FIG. 16D can overlap with each other by sliding; thus, the size of the portable information terminal can be decreased, which makes the portable information terminal suitable for being carried.

The external connection terminal 2808 can be connected to various types of cables such as a charging cable and a USB cable, and charge and data communication with a personal computer or the like are possible. Further, a large amount of data can be handled by insertion of a high-capacity storage medium into the external memory slot 2811.

Further, in addition to the above functions, an infrared communication function, a television reception function, or the like may be provided.

Figure 16E:
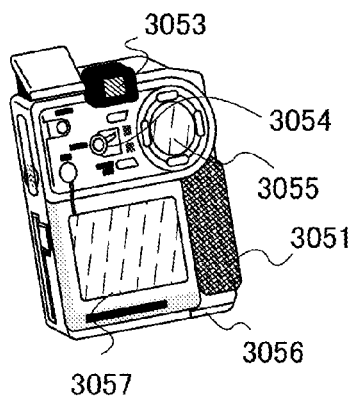

FIG. 16E illustrates a digital video camera including a main body 3051, a display portion A 3057, an eyepiece 3053, an operation switch 3054, a display portion B 3055, a battery 3056, and the like. By applying the semiconductor device described in the other embodiment to the display portion A 3057 and the display portion B 3055, the digital video camera can be highly reliable.

Figure 16F:
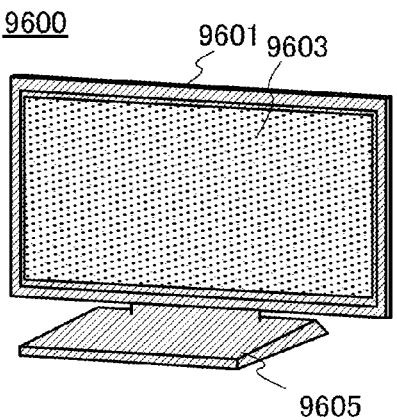

FIG. 16F illustrates an example of a television set. In the television set 9600, a display portion 9603 is incorporated in a housing 9601. The display portion 9603 can display images. Here, the housing 9601 is supported by a stand 9605. By applying the semiconductor device described in the other embodiment to the display portion 9603, the television set 9600 can be highly reliable.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

This embodiment can be implemented in appropriate combination with the structures described in the other embodiment.

This application is based on Japanese Patent Application serial no. 2010-144694 filed with Japan Patent Office on Jun. 25, 2010, the entire contents of which are hereby incorporated by reference.

What is claimed is:

1. A transistor comprising:
   an insulating layer;
   an oxide semiconductor layer to be a channel formation region over the insulating layer;
   a source electrode layer and a drain electrode layer overlapping with a part of the oxide semiconductor layer;
   a gate insulating layer overlapping with the oxide semiconductor layer, the source electrode layer, and the drain electrode layer; and
   a gate electrode overlapping with a part of the oxide semiconductor layer with the gate insulating layer provided therebetween,
   wherein a thickness of the insulating layer is larger than a thickness of the gate insulating layer, and
   wherein the oxide semiconductor layer In, Zn, and Ga.

2. The transistor according to claim 1, wherein the transistor has a property that, after the oxide semiconductor layer is irradiated with light and the light is turned off, a relaxation time of carriers in photoresponse characteristics of the oxide semiconductor layer has at least two kinds of modes: $\tau_1$ and $\tau_2$, $\tau_1 < \tau_2$ is satisfied, and $\tau_2$ is 300 seconds or less.

3. The transistor according to claim 2, wherein a light source of the light is a white LED.

4. The transistor according to claim 2, wherein the oxide semiconductor layer has a first trap level close to a conduction band and a second trap level close to a valence band.

5. The transistor according to claim 1, wherein the gate insulating layer contains one or more elements selected from constituent elements of the oxide semiconductor layer.

6. The transistor according to claim 1, wherein the insulating layer is a silicon nitride film, a silicon oxide film, a silicon nitride oxide film, a silicon oxynitride film, an aluminum oxide film, a gallium oxide film, or a gallium aluminum oxide film.

7. A semiconductor device comprising:
   a transistor comprising:
      an insulating layer;
      an oxide semiconductor layer to be a channel formation region over the insulating layer;
      a source electrode layer and a drain electrode layer overlapping with a part of the oxide semiconductor layer;
      a gate insulating layer overlapping with the oxide semiconductor layer, the source electrode layer, and the drain electrode layer; and
      a gate electrode overlapping with a part of the oxide semiconductor layer with the gate insulating layer provided therebetween,
   wherein a thickness of the insulating layer is larger than a thickness of the gate insulating layer, and
   wherein the oxide semiconductor layer comprises In, Zn, Ga.

8. The semiconductor device according to claim 7, wherein, after the oxide semiconductor layer is irradiated with light and the light is turned off, a relaxation time of carriers in photoresponse characteristics of the oxide semiconductor layer has at least two kinds of modes: $\tau_1$ and $\tau_2$, $\tau_1 < \tau_2$ is satisfied, and $\tau_2$ is 300 seconds or less.

9. The semiconductor device according to claim 8, wherein a light source of the light is a white LED.

10. The semiconductor device according to claim 8, wherein the oxide semiconductor layer has a first trap level close to a conduction band and a second trap level close to a valence band.

11. The semiconductor device according to claim 7, wherein the gate insulating layer contains one or more elements selected from constituent elements of the oxide semiconductor layer.

12. The semiconductor device according to claim 7, wherein the semiconductor device is applicable to an electronic device.

13. The semiconductor device according to claim 7, wherein the insulating layer is a silicon nitride film, a silicon oxide film, a silicon nitride oxide film, a silicon oxynitride film, an aluminum oxide film, a gallium oxide film, or a gallium aluminum oxide film.

* * * * *

UNITED STATES PATENT AND TRADEMARK OFFICE
CERTIFICATE OF CORRECTION

PATENT NO. : 9,748,401 B2
APPLICATION NO. : 14/547285
DATED : August 29, 2017
INVENTOR(S) : Masashi Tsubuku et al.

It is certified that error appears in the above-identified patent and that said Letters Patent is hereby corrected as shown below:

In the Specification

Column 2, Line 36, replace "$P_o$" with --$P_0$--;

Column 2, Line 42, replace "$P_o$" with --$P_0$--;

Column 2, Line 47, replace "$G_{Op}$" with --$G_{0p'}$--;

Column 3, Line 6, replace "by $t_o$" with --by $t_{0'}$--;

Column 3, Line 25, replace "($I_o$ is" with --($I_0$ is--;

Column 13, Line 58, replace "1 ×" with --1×--;

Column 16, Line 67, after "speaker" insert --2803--;

In the Claims

Column 18, Line 3, in Claim 1, after "layer" insert --comprises--; and

Column 18, Line 39, in Claim 7, insert --and-- before "Ga.".

Signed and Sealed this
Nineteenth Day of December, 2017

Joseph Matal
*Performing the Functions and Duties of the
Under Secretary of Commerce for Intellectual Property and
Director of the United States Patent and Trademark Office*